United States Patent [19]

Lloyd et al.

[11] Patent Number: 4,602,311
[45] Date of Patent: Jul. 22, 1986

[54] STATIC PROTECTIVE HOUSING

[75] Inventors: Robert D. Lloyd, Sunrise; Irving H. Holden, Boca Raton; Gerald E. Brinkley, Coral Springs, all of Fla.

[73] Assignee: Motorola, Inc., Schaumburg, Ill.

[21] Appl. No.: 657,691

[22] Filed: Oct. 4, 1984

[51] Int. Cl.$^4$ .............................................. H05F 1/00
[52] U.S. Cl. ..................................... 361/212; 361/220
[58] Field of Search ............... 361/212, 216, 220, 386, 361/395, 399, 424, 394, 415; 206/328, 329, 330, 334

[56] References Cited

U.S. PATENT DOCUMENTS 4,409,641 10/1983 Jakob et al. ...................... 361/399 X
4,528,616 7/1985 Koppensteiner .................... 361/399

Primary Examiner—L. T. Hix
Assistant Examiner—Douglas S. Lee
Attorney, Agent, or Firm—Daniel K. Nichols; Joseph T. Downey; Edward M. Roney

[57] ABSTRACT

A static protective housing includes a plastic housing having an outer wall and an interior. A metallic fastener extends into the housing from the outer wall. A static vault within the housing receives the metallic fastener for insulating the fastener from the housing interior. The static vault is provided with a well portion which receives the fastener and a cover which closes the well portion.

4 Claims, 4 Drawing Figures

STATIC PROTECTIVE HOUSING

BACKGROUND OF THE INVENTION

This invention relates to housings in general and, in particular, to housings for static-sensitive electronic circuitry. CMOS electronic circuitry is particularly susceptible to damage by excessive voltages. Static electric discharges can have catastrophic effect on CMOS circuitry, and as such it is important to protect CMOS circuitry as well as other electronic circuitry from such static electric discharge.

CMOS circuitry is characterized by its low power and low voltage properties which make it highly desirable for use in battery operated portable electronic equipment such as radio paging receivers. In order to reduce the weight of such units, it is desirable to manufacture housings for pagers and similar equipment out of lightweight plastics. Such plastic housings do provide electro-static insulation. A problem can exist when it is necessary to extend metallic elements such as fasteners through the outer wall of the plastic housing to its interior. Such electrically conductive fasteners can provide a point for the buildup of static-electric charges and allow current flow to the interior of the housing where it can flow through air and damage CMOS circuitry.

While it is possible to utilize non-conductive fasteners, such fasteners generally do not have the same characteristic strength of metallic fasteners. In products such as pagers which are worn on or about the clothing of a person, a static-electric charge can easily be built up on a metallic member having a surface at the exterior of the housing.

SUMMARY OF THE INVENTION

This static protective housing for electronic circuitry provides a means for inhibiting the flow of electric current to the interior of the housing from conductive members extending from the outside of the housing.

In one aspect of the invention, a metallic member extends from the exterior of the housing. A static vault means is located within the housing and receives an end of the member to insulate it from the interior of the housing.

The static vault includes a well portion. A fastening element engages the member within the vault for retaining the member in place. In another aspect of the invention a cover is sealed over the well to insulate the vault interior from the interior of the housing.

In yet another aspect of the invention, a member extends through the housing to a vault spacially separated from the housing end wall. A gasket means surrounds the member between the housing end wall and the vault to prevent the flow of electric current to the interior of the housing.

DESCRIPTION OF THE PREFERRED EMBODIMENTS

Figure 1:
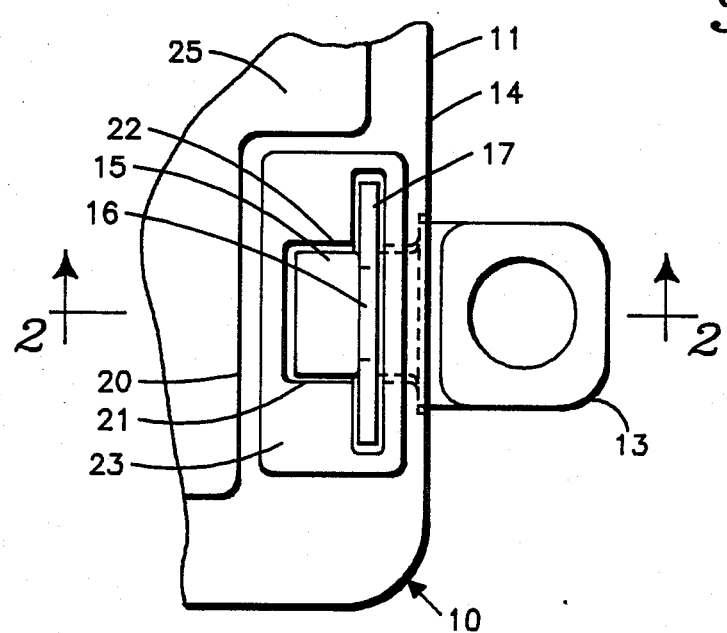
FIG. 1 is a fragmentary cross-sectional view of an embodiment of the housing of the invention.
Figure 2:
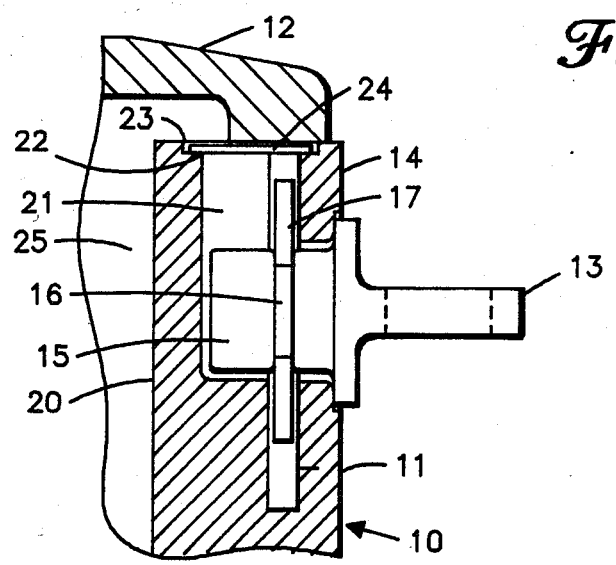
FIG. 2 is a fragmentary cross-sectional elevational view of the housing of FIG. 1.

Referring now by characters of reference to the drawings and first to FIGS. 1 and 2, it will be understood that the housing 10 of this embodiment includes a body portion 11 and a cover portion 12 which provide housing outer walls. A conductive member such as strap receiving member 13 extends from exterior of the housing through an outer wall 14 and includes a shank 15 having a groove 16 which receives a E-clip retainer 17.

In this embodiment a inner wall 20 is formed intergrally with the outer wall 14. A well 21 is formed between the inner and outer walls 20 and 14 and is dimensioned to receive the shank 15 and E-clip 17. The well includes an upper open margin 22. An enlarged opening 23 formed in the inner and outer walls 20 and 14 adjacent to the margin 22 and is provided for receipt of a cover 24 which can be attached as by adhesive or ultrasonic sealing. The cover 24 acts to enclose the well 21 and provides, with the inner and outer walls 20 and 14, a static vault for isolating the member 13 from the interior space of the housing indicated generally by 25.

Figure 3:
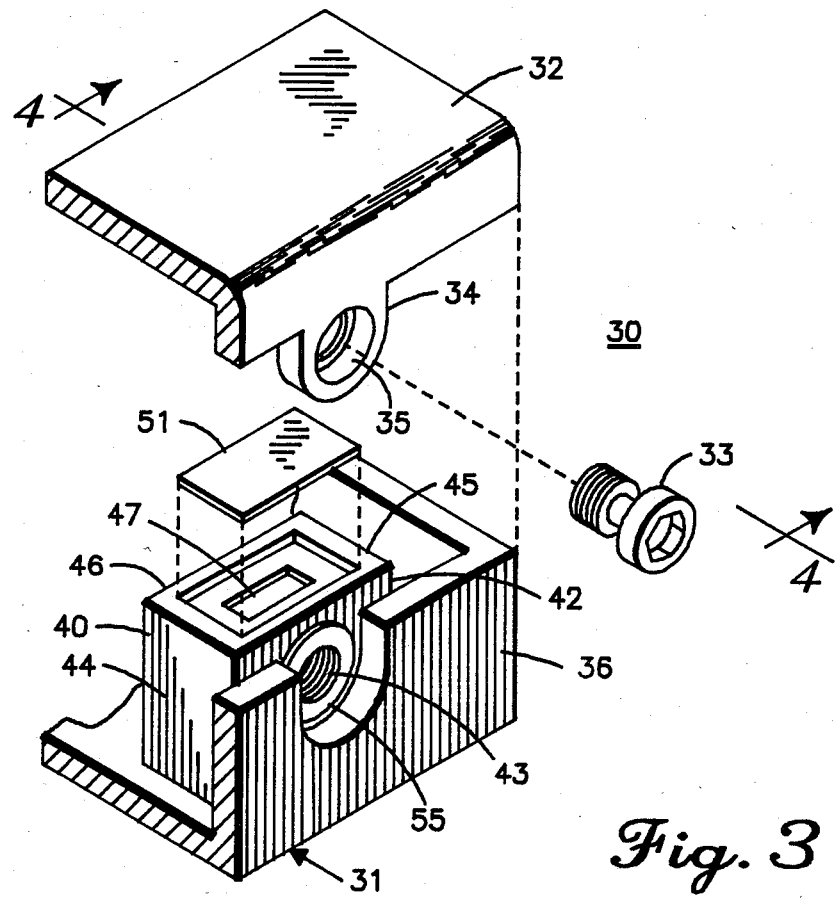
FIG. 3 is a fragmentary exploded view of another embodiment of the housing invention.
Figure 4:
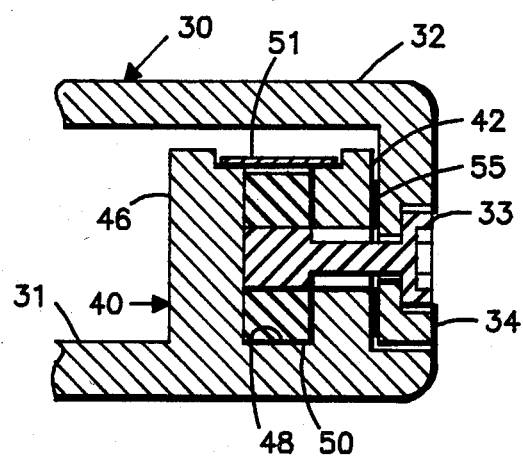
FIG. 4 is a fragmentary cross-sectional view of the housing of FIG. 3.

Referring now to FIGS. 3 and 4, an alternative embodiment of the invention is disclosed. In this embodiment a housing generally indicated by 30 includes a lower portion 31 and a cover piece 32. A threaded fastening member 33 constituting a conductive member is utilized for connecting the cover piece 32 to the lower portion 31.

The cover piece 32 includes an end portion 34 having a opening 35 for receiving the threaded member 33. The bottom piece 31 includes an end wall 36 which is dimensioned to interfit with the end portion 34 located adjacent to the end wall 36 and integrally formed with the bottom portion 31 is a static vault 40. The vault 40 includes a upstanding front wall 42 having an aperture 43 therethrough. Vault 40 includes opposed upstanding side walls 44 and 45 and the end wall 46. Walls 42, 44, 45, and 46 cooperating to provide an open top well 48 having an upper margin 47 and is dimension to receive a fastener means such as nut 50 for attachment of fastening member 33. The upper margin 47 includes a depression for receiving a cover 51 which can be attached as by adhesive or ultra-sonic welding.

A sealing gasket 55 is positioned against the wall 42 about the opening 43 for abutment against the end wall 34 about its opening 35.

It is thought that the structural and functional advantages have become fully apparent from the foregoing description of parts, but for completeness of disclosure, a brief description of the function and operation of the embodiments will be given. It will be understood that the particular shape and dimensions of the static protective housing can be chosen depending upon the particular application. The housings 10 and 30 provide complete enclosed structures. In order to facilitate understanding of the invention, the drawings show only the portions of the housings 10 and 30 at which the static vaults are located. It will be understood that complete housings are provided.

Referring now to FIGS. 1 and 2, the electric conductive fastener element 13 extends from the exterior wall 11 of the housing 10 into the housing. In the prior art approach, the E-clip 17 would have been utilized to retain the element 13. However, there would be no static vault and both the shank portion 15 and E-clip 17 would present a direct path for the flow of electricity from the exterior of the housing 10 to interior 25 of the housing.

It will be understood that FIG. 1 shows the assembly without the cover 24 in place. In assembly, the shank portion 15 is inserted into the housing and the E-clip 17 is then positioned on the groove 16 of the shank portion 15. The cover 24 is then positioned and is either sonically or adhesively sealed over the well 21 and the cover portion 12 can then be positioned to close the housing 10.

The housing 30 of FIGS. 3 and 4 illustrates the use of another type conductive member, threaded member 33, for fastening a cover to a housing. In construction, a static vault 40 is provided within the housing 30. The threaded fastener such as the nut 50 is positioned within the well 48 of the static vault 40 and a cover 51 is then sealed to close the well 48 thereby isolating it from the interior of housing 10.

The sealing gasket 55 is utilized to provide a static seal about the threaded member 33 where it passes between the end wall 34 and the end wall 42 of static vault.

In the prior art devices the nut 50 as well as threaded end of screw 33 would have been directly exposed to the interior of the housing 30 thereby allowing a direct path of the flow of electric current through the threaded screw 33 to the interior of the housing.

While the static vault of FIGS. 3 and 4 is shown as integrally formed with the lower part 31 of the housing, it will be understood that the vault 40 could be separately formed and positioned within the housing 30.

We claim as our invention:

1. A static protective housing comprising:
   a plastic housing having an outer wall and an interior,
   a conductive member extending into the housing from the outer wall, and
   a static vault located within the housing outer wall and receiving the conductive member for insulating the member from the housing interior,
   the static vault being provided with a well portion for receiving the member, and a cover portion for closing the well portion to the interior of the housing,
   a fastener element located in the well and engaging the conductive member for selectively retaining the member,
   the static vault being integrally formed with the housing of plastic material, and
   the static vault being integrally formed with the housing outer wall.

2. A static protective housing as defined in claim 1 in which:
   the fastener element is an E-ring retainer.

3. A static protective housing comprising:
   a plastic housing having an outer wall and an interior,
   a conductive member extending into the housing from the outer wall, and
   a static vault located within the housing outer wall and receiving the conductive member for insulating the member from the housing interior,
   the static vault being provided with a well portion for receiving the member, and a cover portion for closing the well portion to the interior of the housing,
   the static vault being formed of plastic material and having an aperture for receiving the conductive member, and
   the static vault is located adjacent to the outer wall, and a sealing gasket is positioned between and engages the outer wall and static vault about the aperture.

4. A static protective housing as defined in claim 9, in which:
   the fastener element is a threaded nut.

* * * * *